(12) United States Patent
Suzuki

(10) Patent No.: US 6,572,022 B2
(45) Date of Patent: Jun. 3, 2003

(54) INFORMATION RECORDING TAG

(75) Inventor: Kazuaki Suzuki, Kanuma (JP)

(73) Assignee: Sony Chemicals Corporation, Toyko (JP)

( * ) Notice: Subject to any disclaimer, the term of this patent is extended or adjusted under 35 U.S.C. 154(b) by 50 days.

(21) Appl. No.: 09/756,847

(22) Filed: Jan. 10, 2001

(65) Prior Publication Data

US 2001/0008684 A1 Jul. 19, 2001

(30) Foreign Application Priority Data

Jan. 17, 2000 (JP) .................................... 2000-010258

(51) Int. Cl.$^7$ .............................................. G06K 19/06
(52) U.S. Cl. ....................................... 235/492; 235/487
(58) Field of Search ................................ 235/487, 492; 283/98, 99, 100, 101, 81

(56) References Cited

U.S. PATENT DOCUMENTS

| | | | | |
|---|---|---|---|---|
| 4,000,488 A | * | 12/1976 | Ephraim | ..................... 340/280 |
| 5,031,026 A | * | 7/1991 | Ueda | ..................... 257/679 |
| 5,581,065 A | * | 12/1996 | Nishikawa et al. | ........ 235/492 |
| 5,635,917 A | | 6/1997 | Todman | |
| 5,884,425 A | * | 3/1999 | Baldwin | ..................... 40/638 |
| 5,898,370 A | | 4/1999 | Reymond | |
| 5,936,525 A | * | 8/1999 | Leyden et al. | .......... 340/568.2 |
| 6,050,622 A | | 4/2000 | Gustafson | |
| 6,215,400 B1 | * | 4/2001 | Rand et al. | .............. 340/568.2 |

FOREIGN PATENT DOCUMENTS

WO    WO 93/12513    6/1993

* cited by examiner

*Primary Examiner*—Diane I. Lee
*Assistant Examiner*—Daniel Hess
(74) *Attorney, Agent, or Firm*—Oliff & Berridge

(57) ABSTRACT

An information recording tag contains:

an IC module in which a resonance circuit and an IC chip 3 are packaged on a substrate 1 where the resonance circuit has an antenna coil 2 and a film condenser 5; and an adhesive 17 that is applied to the IC module in order to adhere said IC module onto an adherend, wherein an empty portion 18 that is adhesive-free has been formed in the adhesive 17 so as to distinguish an area on the IC module where the area contains the film condenser 5 from other areas on the IC module.

6 Claims, 5 Drawing Sheets

(x-x cross section view)

(x-x cross section view)

INFORMATION RECORDING TAG

BACKGROUD OF THE INVENTION

1. Field of the Invention

The present invention relates to an information recording tag, in which an IC module has been embedded, that is affixed to an adherend and that is utilized to record the product data of the adherend.

2. Description of the Related Art

For a variety of products, there are information recording tags in which an IC module is embedded and that are utilized by affixing them to a prescribed product as a tag to record all kinds of data such as the manufacturer, product name, year/month/day of manufacture, specifications, and current usage frequency.

As illustrated in FIGS. 7A and 7B, an information recording tag such as this is typically constituted by packaging a resonance circuit, which has an antenna coil 2 and a film condenser 5, and an IC chip 3 onto a substrate 1 made of an insulation film, sealing it with a sealing resin 11 made of a thermal hardening resin such as an epoxy resin or a hot melting resin such as polyester, laminating an outer layer film 13 made of a polyester film and the like onto the surface of the substrate 1 through an adherent 12 such as acrylic based resin or the like, and laminating a release paper 15 onto the surface of its opposite side through an adhesive 14. This release paper 15 is peeled off at the time the information recording tag is affixed as a tag to the prescribed product that constitutes the adherend, and the IC module that has been resin-sealed is laid upon the prescribed adherend. The prescribed product information is recited on the outer film 13.

In order to prevent improper usage of a data recording tag where the improper usage includes that an information recording tag may have been improperly detached or used on products that are different from the adherend to which it should originally have been affixed, it is preferable for an information recording tag to be allowed to be broken itself if the information recording tag is improperly detached after it has once been affixed to the adherend.

SUMMARY OF THE INVENTION

The present invention is intended to solve the problems in conventional technology such as those mentioned above. Thus, it is an object of the present invention to allow a resonance circuit that is embedded in an information recording tag to be easily broken when attempting to detach the information recording tag from an adherend after it has once been affixed to the prescribed adherend, and thereby to prevent improper usage of the information recording tag.

The inventor perfected the invention by finding out that the area on an IC module which contains a film condenser can be easily broken up by applying an adhesive on an IC module and ensuring that a shape pattern of the adhesive can be separated into an area that contains the film condenser on the IC module and other areas, without sealing the IC module with a sealing resin where the IC module is embedded in the information recording tag.

In other words, the present invention provides an information recording tag comprising:

an IC module in which a resonance circuit and an IC chip are packaged on a substrate where the resonance circuit has an antenna coil and a film condenser; and an adhesive that is applied to the IC module in order to adhere said IC module onto an adherend, wherein an empty portion that is adhesive-free has been formed in the adhesive so as to distinguish an area on the IC module where the area contains the film condenser from other areas on the IC module.

DETAILED EXPLANATION OF THE INVENTION

Figure 1A:
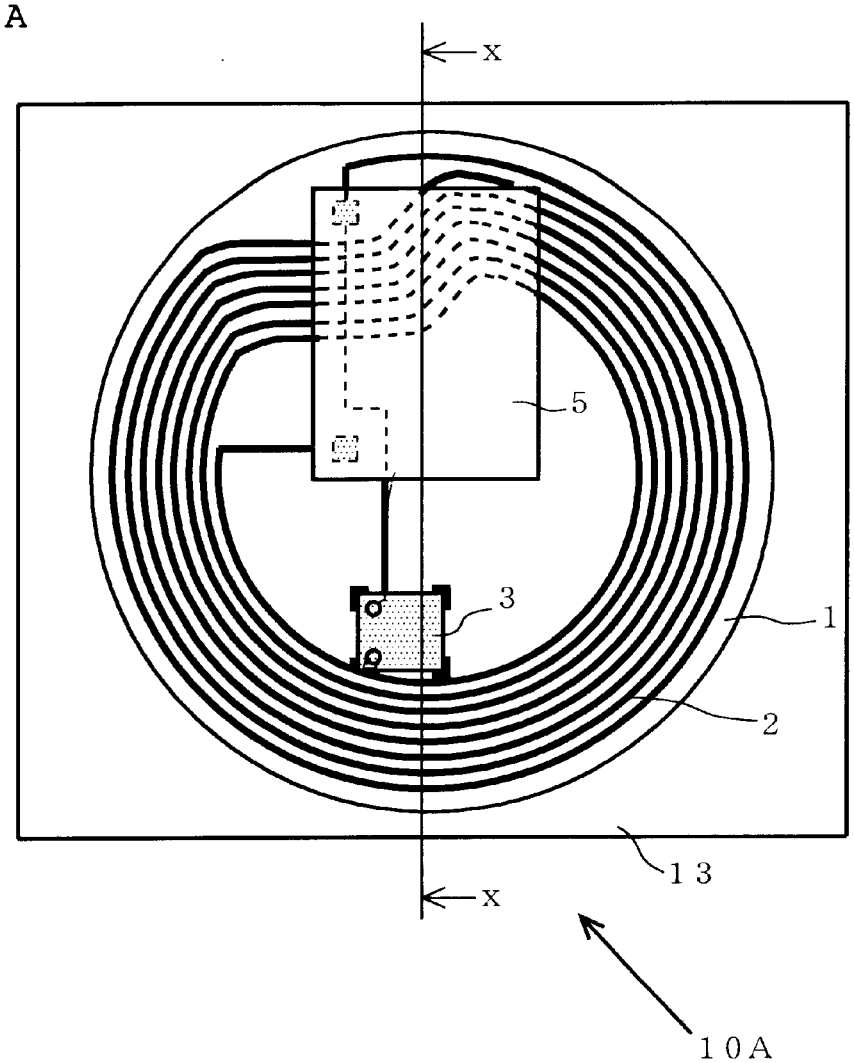
FIGS. 1A and 1B are a plane view and a cross-sectional view, respectively, of the information recording tag of the present invention.

The invention will be explained in detail below while referring to the drawings. Moreover, identical reference numbers will indicate identical or similar constitutional elements in each drawing.

Figure 1B:
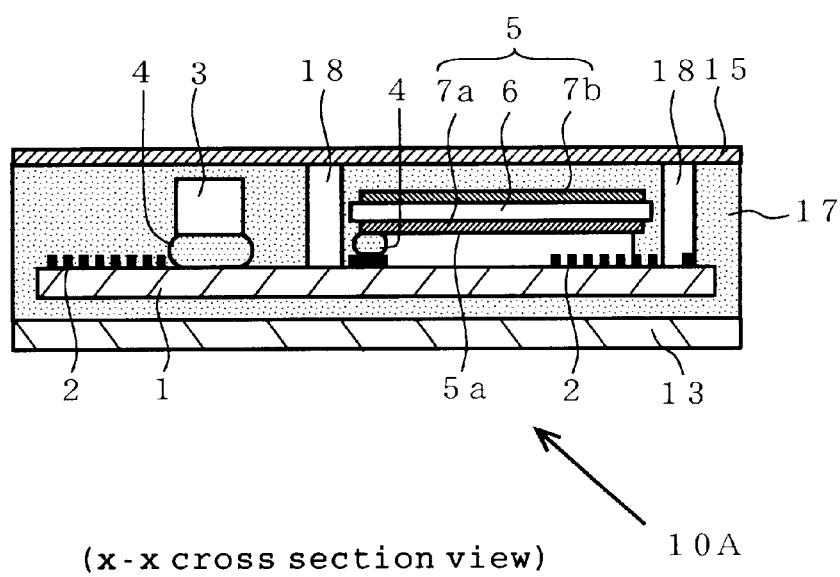

FIGS. 1A and 1B are a plane view and a cross-section view, respectively, of an information recording tag 10A of the present invention that will be affixed to an ink ribbon, video film, and other types of products, and record their product data.

This information recording tag 10A is a device in which an antenna coil 2, an IC chip 3 and a film condenser 5 are packaged on a substrate 1 made of PET, polyimide and other insulation films to form an IC module. A release paper 15 is laminated through an adhesive 17 which can function as a filler, to the IC module's film condenser 5 side and then an outer film 13 such as polyester film is laminated through the adhesive 17 to the opposite side. This release paper 15 is allowed to be peeled off when the information recording tag 10A is affixed to the prescribed adherend.

Figure 2A:
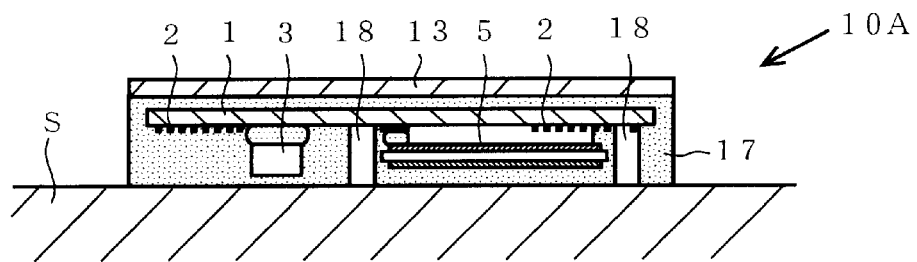
FIGS. 2A and 2B are explanation views of an operation for preventing improper usage of the information recording tag of the invention.
Figure 2B:
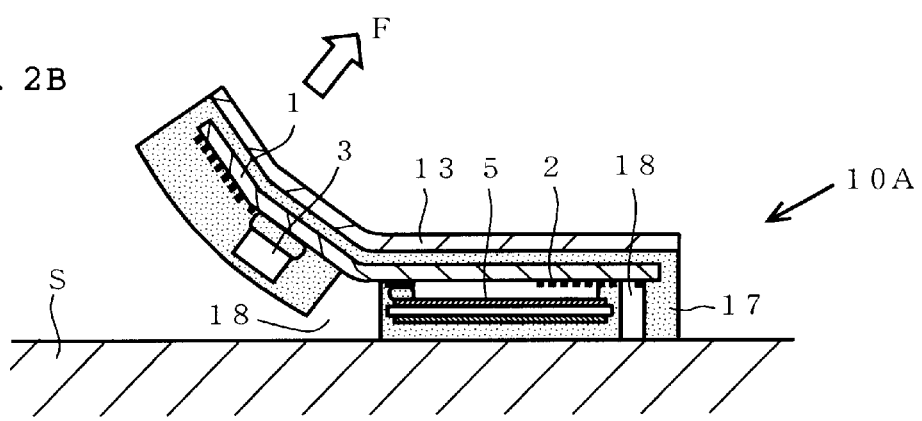

With this information recording tag 10A, a significant feature of the present invention resides in that an empty portion 18 (adhesive-free portion) has been provided in the adhesive 17 on the IC module so that an area that contains a film condenser 5 on the IC module and other areas on the IC module are distinguished from each other. On this basis, as illustrated in FIG. 2A, if one tries to remove the information recording tag 10A from the adherend S after the release paper 15 has peeled off and removed, and the information recording tag 10A has been affixed to the specified adherend S, as shown in FIG. 2B, the information recording tag 10A will buckle significantly in the empty portion 18 and cause major strain on the film condenser 5. As a consequence, the film condenser 5 or the resonance circuit in its vicinity are easily broken, and this can prevent their reuse after the information recording tag has been detached.

Figure 3:
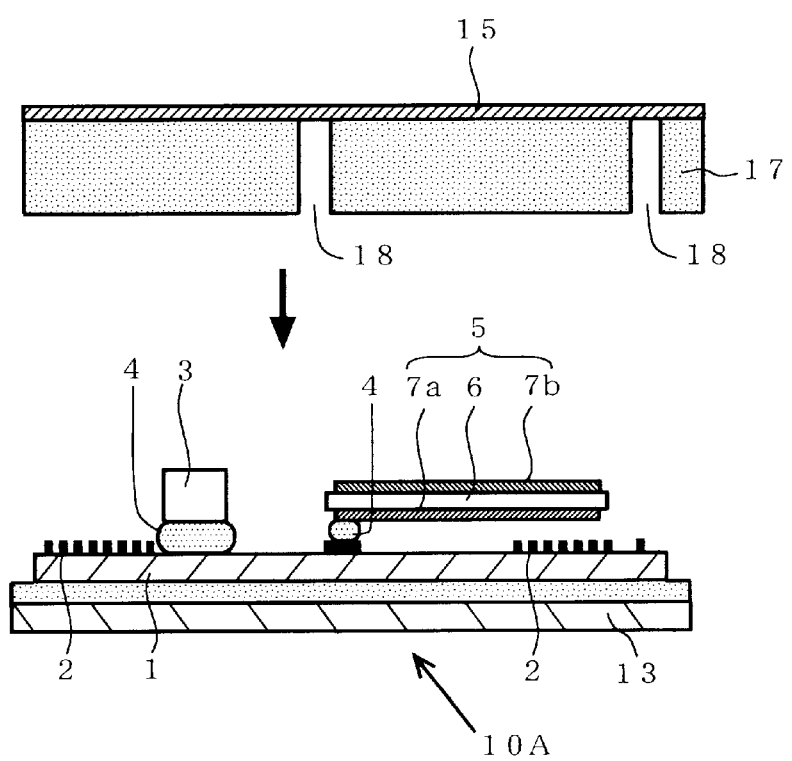
FIG. 3 is an explanation view of a method for manufacturing the information recording tag of the present invention.

As a method for forming this sort of empty portion 18 in the adhesive 17, for example, as shown in FIG. 3, a printed pattern of adhesive 17 is formed such that the empty portion 18 is formed on the release paper 15, and is coated and crimped onto the IC module that is attached to the exterior coated film 13. Further in this case, as an adhesive to attach an IC module to the outer film 13, a substance that is comparable to the adhesive 17 for printing onto the release paper 15 can be utilized.

Figure 4A:
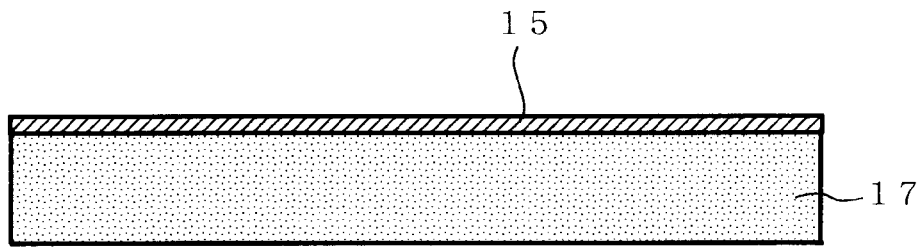
FIGS. 4A and 4B are explanation views of a method for manufacturing the information recording tag of the present invention.
Figure 4A:
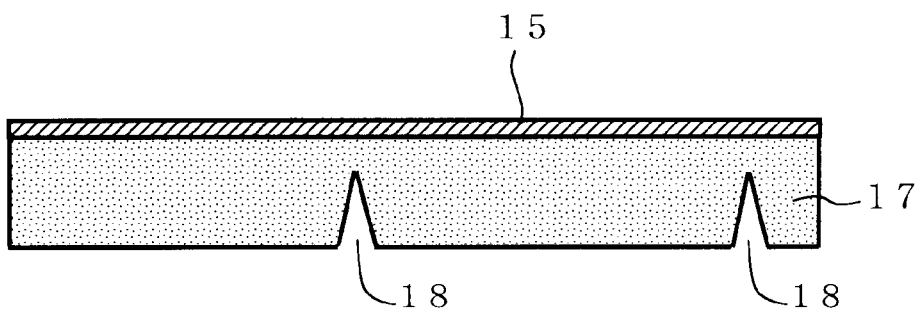
Figure 4B:
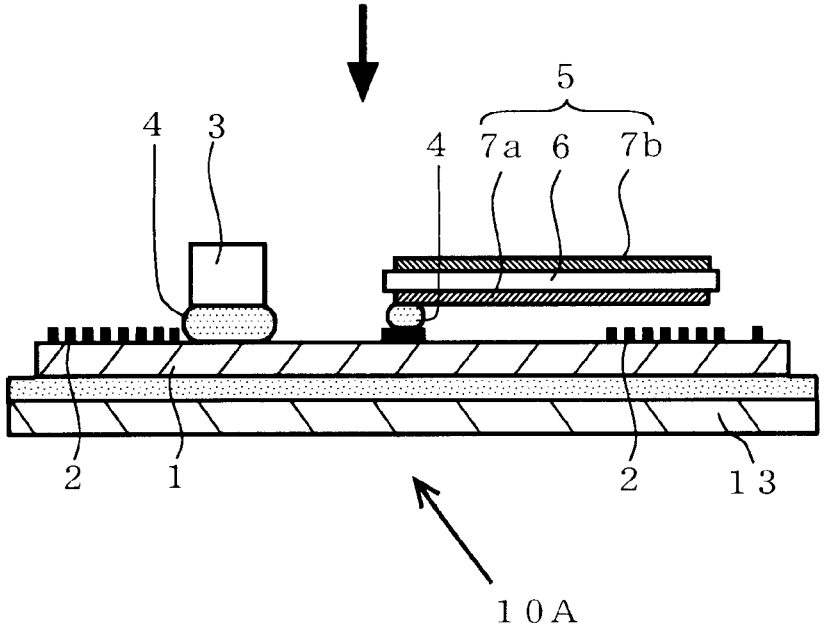

Alternately, as shown in FIG. 4A, it is also acceptable for a uniform layer-type coating of the adhesive 17 to be applied on the release paper 15. After that, as illustrated in FIG. 4B, by half cutting the adhesive layer, the empty portion 18 of the adhesive is formed. This is then coated and crimped onto the IC module that is attached to the outer film 13.

Here, it is preferable to use a film-shaped bonding agent as an adhesive 17 from the standpoint of the workability of a half cut and so on.

On the other hand, with this information recording tag 10A, the antenna coil 2 can be formed by etching the copper in a laminate layer made of insulation film and copper foil, where the insulating film constitutes the substrate 1. Also, an IC chip 3 is packaged on the substrate 1 in a face-down manner by an anisotropic conductive adhesive 4.

As a film condenser 5, it is possible to use a variety of film-shaped condensers, but the use of a mica condenser made of a mica film 6 and electrodes 7a and 7b which are formed on the surface thereof is preferable. As the mica film 6 has a low water absorbability, the use of the mica condenser 5 can prevent the resonance frequency of the IC module from deviating from an intended resonance frequency due to moisture. Moreover, the bonding interface between the mica film 6 and its surface electrodes 7a and 7b has a lower adhesive strength in comparison to that between electrodes 7a and 7b and the adhesive 17. As it becomes easier for breakage of the mica condenser 5 to occur due to separation between the mica film 6 and its electrodes 7a and 7b if an attempt is once made to remove the information recording tag 10A that has been affixed to an adherend from the adherend, it is possible to further prevent improper usage of the information recording tag 10A.

As for the mica condenser 5, the electrode portion is connected to the substrate 1 by an anisotropic conductive adhesive 4 but the non-electrode portion of the mica condenser 5 is not connected to the substrate 1 by the anisotropic conductive adhesive. Also, while the peripheral portion of the mica condenser 5 is attached to the substrate 1 by the adhesive 17, the adhesive 17 is not present on the opposing face 5a of the substrate 1 in the central portion of the mica condenser 5, it is preferable to make the substrate 1 in the core of the mica condenser 5 in a non-adhesive state. In this manner, if the mica condenser 5 is connected in its entirety to the substrate 1 by only its electrodes, when attempting to remove the information recording tag 10A after it has once been affixed, it becomes easier for the portion connected to the substrate 1 on the mica film condenser 5 to break and the improper use of the information recording tag 10A can be prevented with further certainty.

Figure 5:
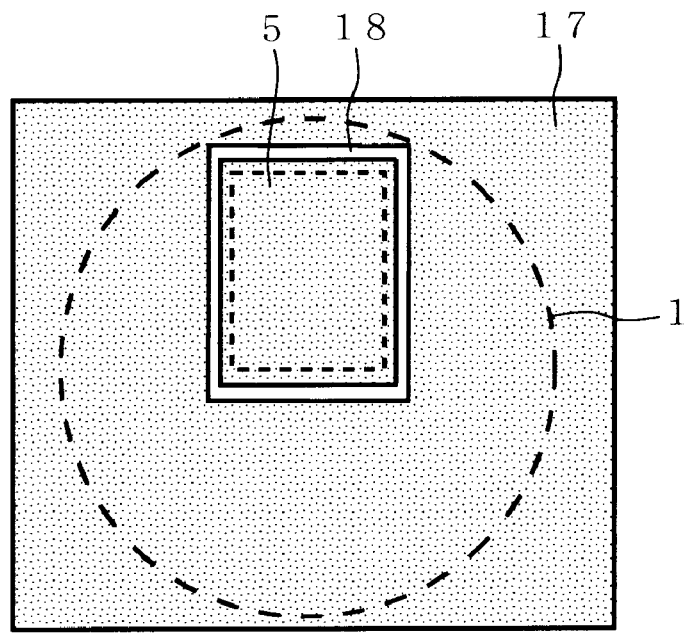
FIG. 5 is an explanation view of a form embodiment for the adhesive-free portion on the information recording tag of the present invention.
Figure 6:
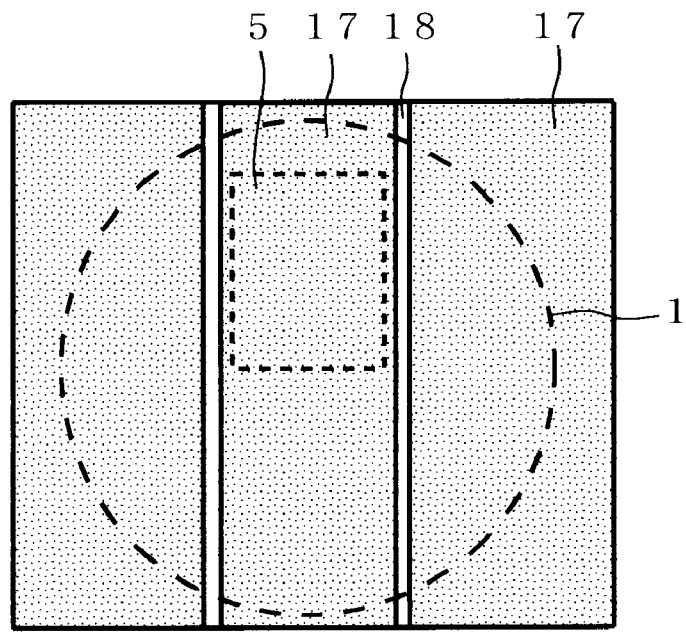
FIG. 6 is an explanation view of a form embodiment for the adhesive-free portion on the information recording tag of the present invention.
Figure 7A:
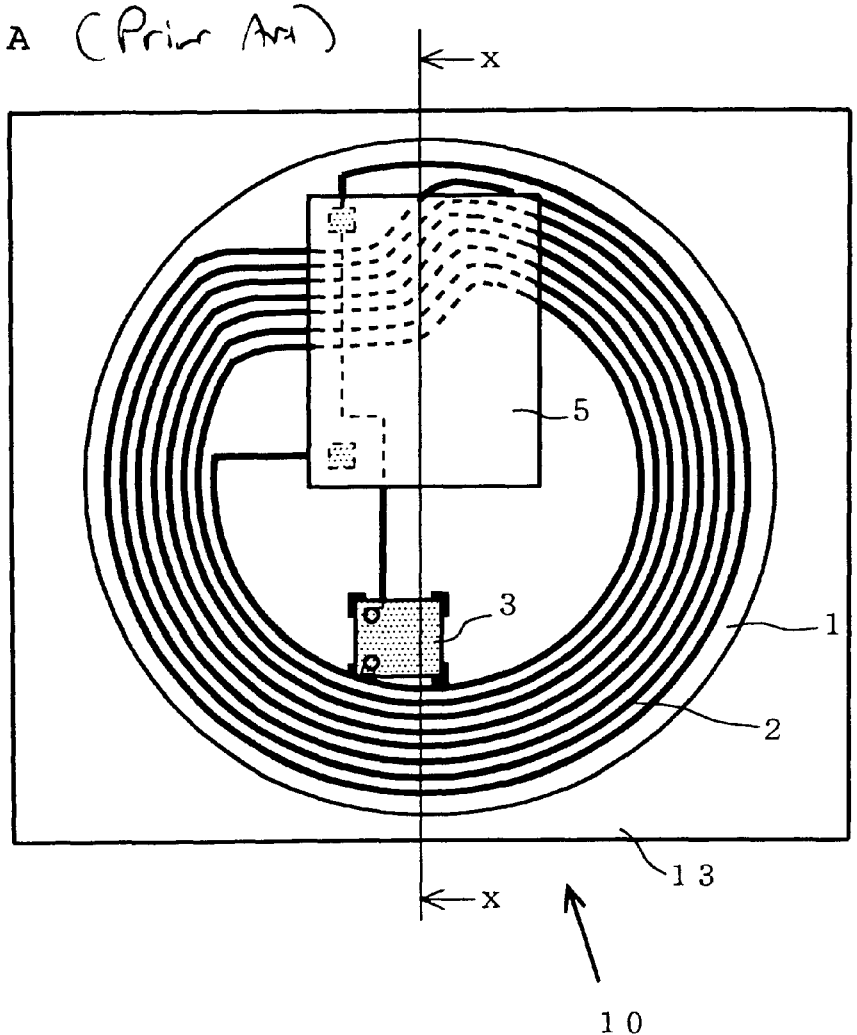
FIGS. 7A and 7B are a plane view and a cross-sectional view, respectively, of a conventional information recording tag.
Figure 7B:
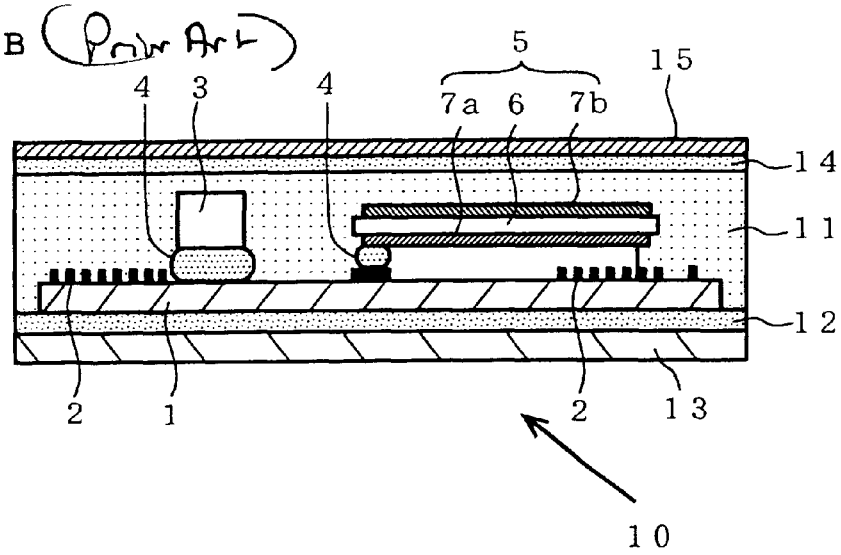

The information recording tag of the invention can result in a variety of embodiments without being limited to the information recording tag 10A in the description above. For example, as long as the empty portion 18 of the adhesive 17 is formed so as to distinguish an area that contains the film condenser 5 on the IC module from other areas on the IC module, the type, shape and wiring of the respective antenna coil 2, IC chip 3 and film condenser 5 that constitute the IC module can be determined on the basis of their suitability. As for the embodiment of the shape of the empty portion 18 of the adhesive 17 in this instance, for example, the area on the IC module that contains the film condenser 5 may also be surrounded by the empty portion 18 of the adhesive 17, as in FIG. 5, or the area that contains the film condenser 5 on the IC module need not be encircled by the empty portion 18 of the adhesive 17, as is illustrated in FIG. 6.

With the information recording tag of the invention, improper usage of an information recording tag can be prevented in as much as the film condenser or the resonance circuit surrounding the film condenser that are embedded in the information recording tag are easily broken when attempting to remove that information recording tag from an adherend after it has once been affixed to the prescribed adherend.

The entire disclosure of the specification, claims and drawings of Japanese Patent Application No. 2000-10258 filed on Jan. 17, 2000 is hereby incorporated by reference.

What we claim is:

1. An information recording tag comprising:

an IC module in which a resonance circuit and an IC chip are packaged on a substrate where the resonance circuit has an antenna coil and a film condenser; and an adhesive that is applied to the IC module in order to adhere said IC module onto an adherend, wherein an empty portion that is adhesive-free has been formed in the adhesive so as to distinguish an area on the IC module where the area contains the film condenser from other areas on the IC module.

2. The information recording tag of claim 1, wherein the film condenser is a mica condenser.

3. The information recording tag of claim 1, wherein the empty portion that is adhesive-free is formed from a pre-printed pattern of adhesive.

4. The information recording tag of claim 1 wherein the empty portion that is adhesive-free is formed by a half cut of an adhesive layer to be allowed to adhere to the IC module.

5. The information recording tag of claim 2, wherein the empty portion that is adhesive-free is formed from a pre-printed pattern of adhesive.

6. The information recording tag of claim 2, wherein the empty portion that is adhesive-free is formed by a half cut of an adhesive layer to be allowed to adhere to the IC module.

* * * * *